United States Patent [19]

Seki

[11] Patent Number: 6,063,641
[45] Date of Patent: May 16, 2000

[54] METHOD OF MEASURING ELECTRICAL CHARACTERISTICS OF SEMICONDUCTOR CIRCUIT IN WAFER STATE AND SEMICONDUCTOR DEVICE FOR THE SAME

[75] Inventor: Hideo Seki, Saitama, Japan

[73] Assignee: Honda Giken Kabushiki Kaisha, Tokyo, Japan

[21] Appl. No.: 09/401,800

[22] Filed: Sep. 22, 1999

Related U.S. Application Data

[62] Division of application No. 08/957,157, Oct. 24, 1997, Pat. No. 5,986,282.

[30] Foreign Application Priority Data

Feb. 18, 1997 [JP] Japan ....................................... 9-49728

[51] Int. Cl.[7] ............................ H01L 21/66; G01R 31/26
[52] U.S. Cl. ................................................................ 438/15
[58] Field of Search .............................. 324/765; 438/15; 257/48

[56] References Cited

U.S. PATENT DOCUMENTS

| | | | |
|---|---|---|---|
| 4,281,449 | 8/1981 | Ports et al. ................................. | 29/593 |
| 5,059,899 | 10/1991 | Farnworth et al. ......................... | 438/18 |
| 5,214,657 | 5/1993 | Farnworth et al. ................... | 371/40.12 |
| 5,241,266 | 8/1993 | Ahmad et al. ........................... | 371/22.5 |
| 5,489,538 | 2/1996 | Rostoker et al. ............................ | 437/8 |
| 5,739,546 | 4/1998 | Saitou et al. .............................. | 257/48 |

*Primary Examiner*—Brian Dutton
*Attorney, Agent, or Firm*—Arent Fox Kintner Plotkin & Kahn

[57] ABSTRACT

A plurality of semiconductor circuits provided on a semiconductor wafer are arranged in a plurality of rows. The plurality of semiconductor circuits of each row are connected in series through first and second conductive layers provided between adjacent two of the semiconductor circuits of each row. The plurality of semiconductor circuits are connected to power supply terminals provided on the semiconductor wafer. The first and second conductive layers may be provided separately from the higher and lower voltage side power supply lines, or one of the first and second conductive layers may be common to one of the higher and lower voltage side power supply lines. The power supply is connected to the power supply terminals and the plurality of semiconductor circuits is aged. After the aging, the power supply is disconnected from the power supply terminals. In this state, electrical characteristics of each semiconductor circuit is measured in a state in which the semiconductor circuits is isolated from the other semiconductor circuits.

5 Claims, 6 Drawing Sheets

METHOD OF MEASURING ELECTRICAL CHARACTERISTICS OF SEMICONDUCTOR CIRCUIT IN WAFER STATE AND SEMICONDUCTOR DEVICE FOR THE SAME

CROSS REFERENCE TO RELATED APPLICATIONS

This application is a divisional application of U.S. patent application Ser. No. 08/957,157, filed Oct. 24, 1997, now U.S. Pat. No. 5,986,282.

BACKGROUND OF THE INVENTION

1. Field of the Invention

The present invention relates to a semiconductor device, and more particularly to a method for aging a lot of semiconductor circuits in a wafer state, and measuring the electrical characteristics of each semiconductor circuit, and a semiconductor device for the same.

2. Description of the Related Art

Conventionally, when a semiconductor device composed of a plurality of semiconductor circuits is manufactured on a semiconductor wafer, the electrical characteristics of each of the semiconductor circuits are evaluated after a manufacturing process of the semiconductor device is complete. For this purpose, a test tool is used such that probes of the test tool are directly contacted with pads of each semiconductor circuit. Then, the electrical characteristics of the semiconductor circuit is evaluated. This process is called a probing.

Next, the semiconductor wafer is diced into semiconductor chips corresponding to the semiconductor circuits. Then, the semiconductor chips of good quality are selected in accordance with the evaluated electrical characteristics. Subsequently, the semiconductor chips of good quality are passed through a packaging process such as a die bonding process and a wire bonding process.

Next, the packaged semiconductor chips are put in a furnace in the state in which they are installed on a board and so on, and then a constant load is imposed. This process is called aging or a burn-in.

After the aging, the electrical characteristics are evaluated once again. Then, products in which initial failure occurred are excluded, and only good products are forwarded.

In this way, in the conventional manufacturing process of a semiconductor device, the aging is performed after the individual semiconductor chips are cut down from the semiconductor wafer. For this reason, whether or not the initial failure occurs in each semiconductor chip can not be determined before the dicing. The packaging process and the aging process are performed even to the semiconductor chips having the possibility that the initial failure occurs. Therefore, the material for the packaging process and the time for the aging process to the semiconductor chips in which the initial failure occurred are wasted, resulting in the product price being pushed up. For this reason, the demand is arisen to perform the aging process to the semiconductor device in a wafer state.

To solve the above problem, various methods are proposed. For example, as a first conventional method is proposed in which convex portions such as ball grids are provided for pads of each semiconductor chip corresponding to, for example, power supply pads $V_{DD}$ and $V_{SS}$ on a semiconductor wafer. After a film having patterns for connecting the convex portions is pasted onto the semiconductor wafer, the semiconductor wafer is put in a furnace in the state. In this manner, the aging process is performed in units of semiconductor wafers.

Also, as s second conventional method is proposed in which pads of each semiconductor chip are connected on the semiconductor wafer by wirings, and then aging is performed in a semiconductor wafer unit while voltage is externally applied to the pads.

However, in the first conventional method, it is difficult to provide the stable connection state between the convex portions on the film and the pads on the semiconductor chips for a long time under high temperature. Because a lot of semiconductor chips are connected in parallel and the connection state looks same, it is difficult to determine based on only the consumption current whether the connection state is good or not. As a result, it is difficult to determine the quality of the connection state from outside the furnace.

Also, in the second conventional method, the aging can be performed well. However, in case of the probing, the plurality of semiconductor chips out of the measurement object are also connected to the same power supply lines. For this reason, the characteristic evaluation on, especially, the current consumption is difficult. Also, there is a problem that a dicing blade hits the metal of the wiring pattern which connects between the pads so that the abrasion of the dicing blade is increased, while the dicing is performed. Further, there is another problem in that the diced end of wiring metal is exposed. For this reason, the corrosion of the wiring pattern metal progresses from the exposed end to the inside of the wiring pattern.

SUMMARY OF THE INVENTION

The present invention is accomplished in the view of the above circumstances. An object of the present invention is to provide a method and a semiconductor device in which a plurality of semiconductor circuits can be aged collectively in a semiconductor wafer state.

Another object of the present invention is to provide a method and a semiconductor device in which the electrical characteristics of the plurality of semiconductor circuits can be measured in a semiconductor wafer state independently from each other.

In order to achieve an aspect of the present invention, a semiconductor device includes a plurality of semiconductor circuits formed on a semiconductor wafer, wherein each of the plurality of semiconductor circuits includes a higher voltage side power supply line, a lower voltage side power supply line and a control pattern section, and first and second semiconductor conductive layers provided between adjacent two of the plurality of semiconductor circuits in the semiconductor wafer to overlap the two semiconductor circuits in parts of the first and second semiconductor conductive layers. Here, the higher voltage side power supply line and lower voltage side power supply line of each of the adjacent two semiconductor circuits of the plurality of semiconductor circuits are respectively connected to the corresponding first semiconductor conductive layers and the corresponding second semiconductor conductive layers such that the plurality of semiconductor circuits are connected in series through the higher and lower voltage side power supply lines and the first and second conductive layers. Also, the control pattern section and the first and second semiconductor conductive layers corresponding to each of the plurality of semiconductor circuits form a MOSFET structure.

In this case, each of the higher and lower voltage side power supply lines may includes at least one of a metal wiring layer and a conductive semiconductor layer.

The semiconductor device may further include pads provided on the semiconductor wafer, for supplying higher and lower voltages to the plurality of semiconductor circuits.

When a predetermined voltage is applied to the control pattern section, depletion layers are formed in the first and second semiconductor conductive layers corresponding to the control pattern section to electrically disconnect the semiconductor circuit corresponding to the control pattern section from the other semiconductor circuits.

When the control pattern section includes one control pattern, each of the plurality of semiconductor circuits is electrically isolated from the other semiconductor circuits by applying a predetermined voltage to the control patterns of the adjacent two semiconductor circuits. Alternatively, when the control pattern section includes a first pattern and a second pattern, each of the plurality of semiconductor circuits is electrically isolated from the other semiconductor circuits by applying a predetermined voltage to the first pattern and the second pattern.

The first and second semiconductor conductive layers may be formed in a semiconductor conductive layer of a conductive type which is different from the first and second semiconductor conductive layers.

In order to achieve another aspect of the present invention, a semiconductor device includes a plurality of semiconductor circuits formed on a semiconductor wafer, wherein each of the plurality of semiconductor circuits includes a higher voltage side power supply line, a lower voltage side power supply line and a control pattern, and first and second semiconductor conductive layers, the first semiconductor conductive layer being provided between adjacent two of the plurality of semiconductor circuits to overlap the two semiconductor circuits in a part of the first semiconductor conductive layer, and the second semiconductor layer being provided in common to the plurality of semiconductor circuits. Here, one of the higher voltage side power supply line and lower voltage side power supply line of each of the adjacent two semiconductor circuits of the plurality of semiconductor circuits is connected to the corresponding first semiconductor conductive layer and the other is connected to the second semiconductor conductive layer such that the plurality of semiconductor circuits are connected in series using the first and second semiconductor conductive layers. Also, the control pattern and the first and second semiconductor conductive layers of each of the plurality of semiconductor circuits form a MOSFET structure.

In order to achieve still another aspect of the present invention, a method of testing each of a plurality of semiconductor circuits formed on a semiconductor wafer, includes the steps of:

providing a plurality of semiconductor circuits which are connected to power supply terminals provided onto the semiconductor wafer, wherein the plurality of semiconductor circuits provided on the semiconductor wafer are arranged in a plurality of rows, the semiconductor circuits of each row are connected in series through first and second conductive layers provided at least for adjacent two of the semiconductor circuits of each row;

connecting power supply to the power supply terminals and aging the plurality of semiconductor circuit in a semiconductor wafer state;

disconnecting the power supply from the power supply terminals after the aging; and measuring electrical characteristics of each of the plurality of semiconductor circuits in a state in which each of the plurality of semiconductor circuits is isolated from the other semiconductor circuits.

DESCRIPTION OF THE PREFERRED EMBODIMENTS

A semiconductor device of the present invention will be described below in detail with reference to the attached drawings.

Figure 1:
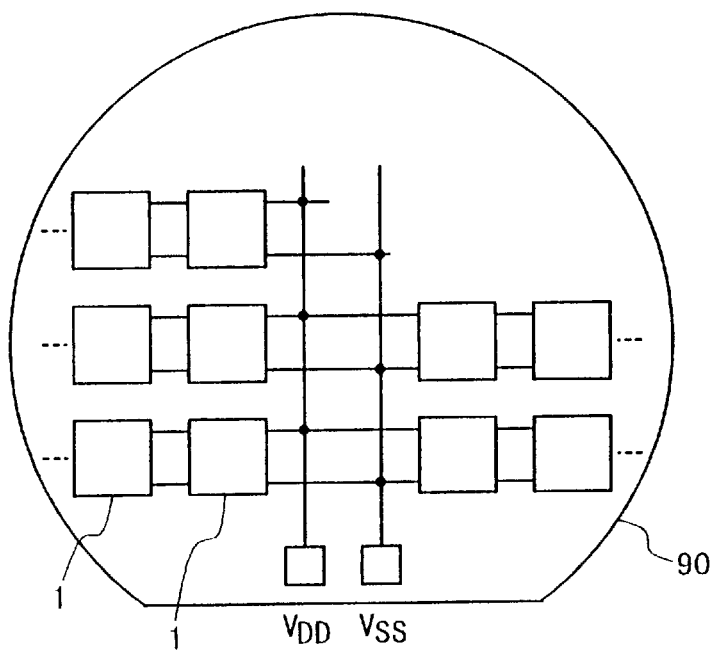
FIG. 1 shows a semiconductor device which is formed on a semiconductor wafer.

FIG. 1 shows a semiconductor wafer 90 on which a semiconductor device of the present invention is formed. In the semiconductor wafer 90, a plurality of semiconductor circuits 1 are formed in a matrix manner by use of a semiconductor manufacturing process which is conventionally well known. Also, in the semiconductor wafer 90, a higher voltage side power supply pad $V_{DD}$ and a lower voltage side power supply pad $V_{SS}$ are provided for connecting a power supply. The plurality of semiconductor circuits 1 are connected in series for every row, and further connected to power supply lines which are connected to the power supply pads $V_{DD}$ and $V_{SS}$.

Figure 2:
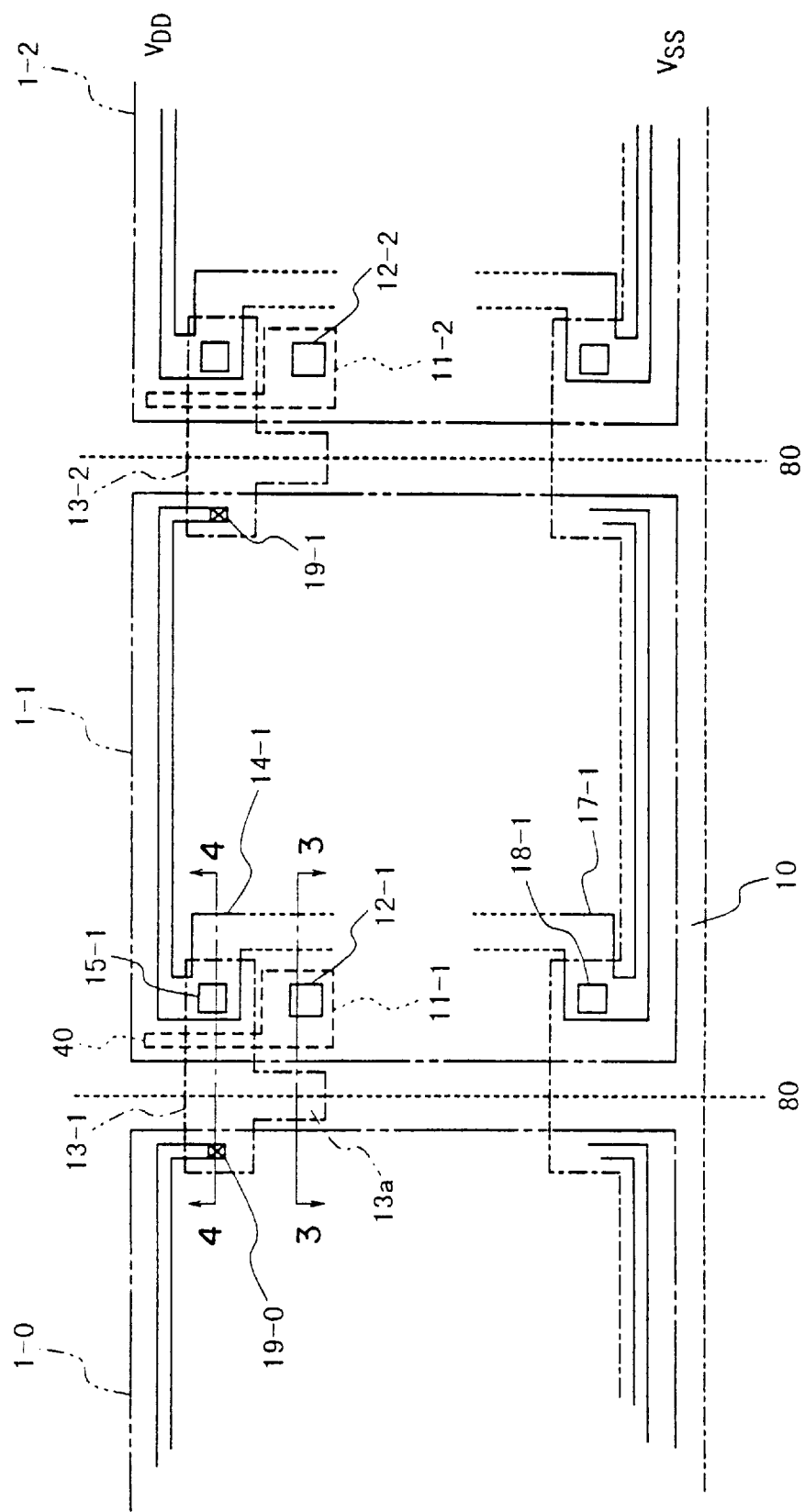
FIG. 2 is a plane arrangement view of semiconductor circuits of a semiconductor device according to a first embodiment of the present invention.

FIG. 2 is a plane arrangement view illustrating a part of one row of the semiconductor circuits 1 formed on the semiconductor wafer 90 according to the first embodiment of the present invention. As shown in FIG. 2, the plurality of semiconductor circuits 1 (1-0, 1-1, 1-2, . . . ) are connected in series by use of an n-type impurity implanted area 10 and an n-type impurity implanted areas 13 (13-1, 13-2, . . . ). The impurity implanted area 10 is connected to the power supply pad $V_{SS}$ on the lower voltage side. The impurity implanted areas 13 are connected to the power supply pad $V_{DD}$ on the higher voltage side in the end portion or center portion of the semiconductor wafer.

Next, referring to FIGS. 2 through 4, the plane internal structure of each semiconductor circuit will be described in detail, taking the semiconductor chip 1-1 as an example. As shown in FIG. 2, in the semiconductor circuit 1-1, a lower voltage side power supply pattern 17-1 is formed on the semiconductor wafer 90 via an insulating film 71. The lower voltage side power supply pattern 17-1 is connected to the impurity implanted area 10 by a contact in addition to an internal circuit (not illustrated). Also, a lower voltage side power supply pad 18-1 is formed via an insulating film 72 on the contact between the lower voltage side power supply pattern 17-1 and the impurity implanted area 10. Thus, each semiconductor circuit 1 is connected to the lower voltage side power supply pad $V_{SS}$ by the impurity implanted area 10.

Figure 3:
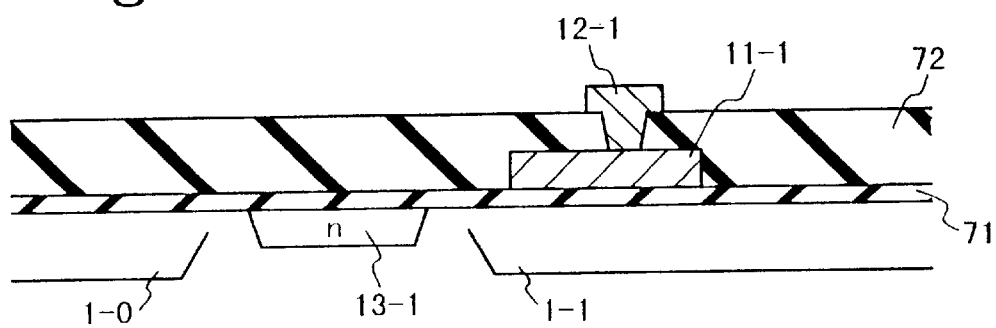
FIG. 3 is a cross sectional view cut the line A–A' in a semiconductor device according to the first embodiment of the present invention which is shown in FIG. 2.
Figure 4:
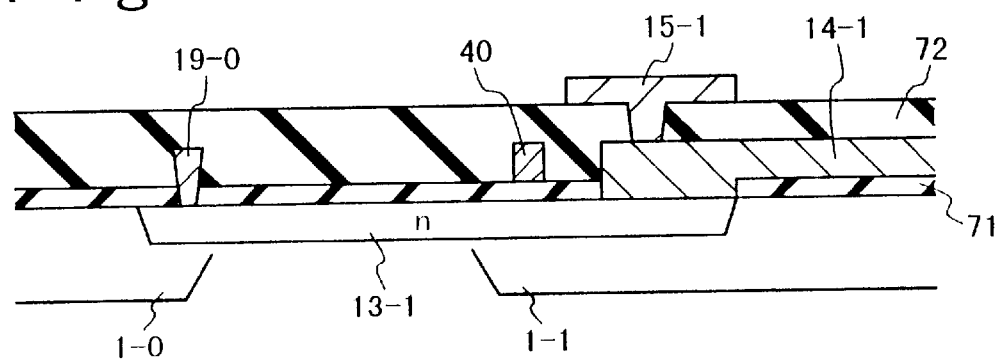
FIG. 4 is a cross sectional view cut the line B–B' in a semiconductor device according to the first embodiment of the present invention which is shown in FIG. 2.

On the other hand, as shown in FIGS. 3 and 4, a higher voltage side power supply pattern 14-1 is formed on the semiconductor wafer 90 via the insulating film 71. The higher voltage side power supply pattern 14-1 is connected to an impurity implanted area 13-1 which is formed between the semiconductor circuits 1-0 and 1-1, by a contact in addition to the above-mentioned internal circuit (not illustrated). Also, the higher voltage side power supply pattern 14-1 is connected to the impurity implanted area 13-2 by a contact 19-1. Further, a higher voltage side power supply pad 15-1 is formed via the insulating film 72 on a contact between the higher voltage side power supply pattern 14-1 and the impurity implanted area 13-1. The semiconductor circuit or impurity implanted area 13 provided in the end of the row is connected to the power supply pad $V_{DD}$ on the higher voltage side. It should be noted that a protrusion portion 13a of the impurity implanted area 13-1 shown in FIG. 2 is not always necessary. That is, the impurity implanted area 13-1 may have a rectangular plane shape.

Further, a control pattern 11-1 is formed via the insulating film 71 on the semiconductor wafer 90. A control end section 40 of the control pattern 11-1 extends beyond the impurity implanted area 13-1. A control pad 12-1 is formed through the insulating film 72 above the control pattern 11-1. When aging is performed, the control pad 12-1 is electrically in a floating state.

The semiconductor circuits 1-0 and 1-2 have the same pattern structure 1-1 as the semiconductor circuit 1-1 in the pattern of the higher voltage side and the pattern of the lower voltage side. In the semiconductor circuit 1-2, a control pattern 11-2 is formed via the insulating film 72 on the semiconductor wafer 90. A control end section 40 of the control pattern 11-2 extends beyond an impurity implanted area 13-2. A control pad 12-2 is formed through the insulating film 72 above the control pattern 11-2.

Next, such a process will be described that aging is performed and then probing is performed on the semiconductor circuits 1 in the state that the semiconductor circuits are formed on the semiconductor wafer 90.

In case of the aging, a power supply is connected to the power supply pads $V_{DD}$ and $V_{SS}$ which have been formed on the semiconductor wafer 90. Because all the semiconductor circuits 1 are connected to the power supply pads $V_{DD}$ and $V_{SS}$ in series by the impurity implanted area 10 and the impurity implanted areas 13 (13-1, 13-2, . . . ), the aging can be performed without using any ball grid and so on. In this case, because the impurity implanted areas 10 and 13 have the impurity concentration of $1 \times 10^{18}$ from $1 \times 10^{17}$, these impurity implanted areas have sufficiently small resistance. Therefore, the voltage drops in the impurity implanted areas are not so large. For this reason, the semiconductor circuits 1 can be sufficiently aged. As a result, the products having initial failure can be made clear.

Next, the probing is performed. In case of the probing, the power supply pads $V_{DD}$ and $V_{SS}$ of the semiconductor wafer 90 are insulated from the power supply. For example, in the probing, a test tool having four probes is used. A first probe is connected to the power supply pad 15-1 on the higher voltage side above the power supply pattern 14-1 on the higher voltage side. A second probe is connected to the power supply pad 18-1 of the lower voltage side above the power supply pattern 17-1 of the lower voltage side. A third probe is connected to the control pad 12-1 of the control pattern 11-1. A fourth probe is connected to the control pad 12-2 of the control pattern 11-2.

The first and second probes are connected to the power supply terminal and ground (GND) terminal of the test tool, respectively. A negative voltage from $-1$ V to $-2$ V is applied to the third and fourth probes. Because the control pattern 11-1 extends beyond the impurity implanted area 13-1, a structure similar to a MOSFET having the control pattern 11-1 as a gate is accomplished. Because the impurity implanted area 13-1 is n-type, a depletion layer spreads by applying the negative voltage to the control pattern 11-1. Therefore, the semiconductor circuit 1-1 can be electrically insulated from the semiconductor circuit 1-0. In the same way, by applying the negative voltage to the control pad 12-2, the semiconductor circuit 1-1 can be electrically insulated from the semiconductor circuit 1-2. In this way, by applying the negative voltage to the third and fourth probes, the semiconductor circuit 1-1 is insulated from the other semiconductor circuits so that the electrical characteristics of the semiconductor circuit 1-1 can be tested independently and individually.

After the test ends, the semiconductor wafer 90 is diced along the dotted lines 80. Any metal pattern does not exist in the dicing area, and only the n-type impurity implanted area exists. For this reason, in the dicing process, a dicing blade is never damaged, and also any corrosion never progresses along the metal pattern, after the dicing.

Figure 5:
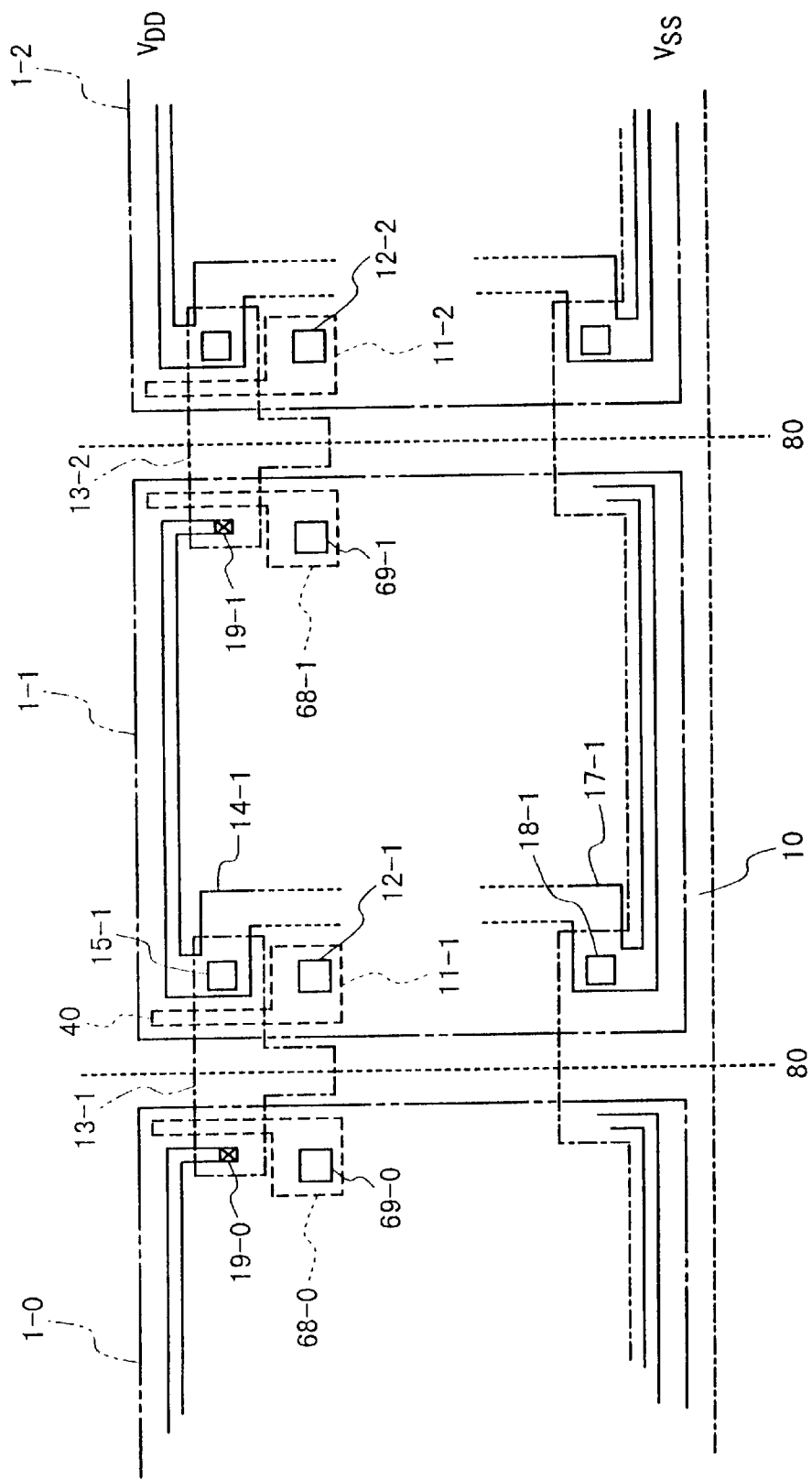
FIG. 5 is a plane arrangement view of a modification example of the semiconductor device according to the first embodiment of the present invention.

According to this embodiment, only the control pattern 11-1 is provided for the semiconductor circuit 1-1. However, if there is a margin in the chip area, two control patterns 11-1 and 68-1 may be provided in the semiconductor circuit 1-1, as shown in FIG. 5. The control pattern 68-1 has the structure similar to the control pattern 11-1, and a negative voltage is applied to a control pad 69-1. In this way, the semiconductor circuit 1-1 may be insulated from the other semiconductor circuits. In this case, because the first through fourth probes can contact the pads in a single semiconductor circuit, the operability in the test can be improved.

Figure 6:
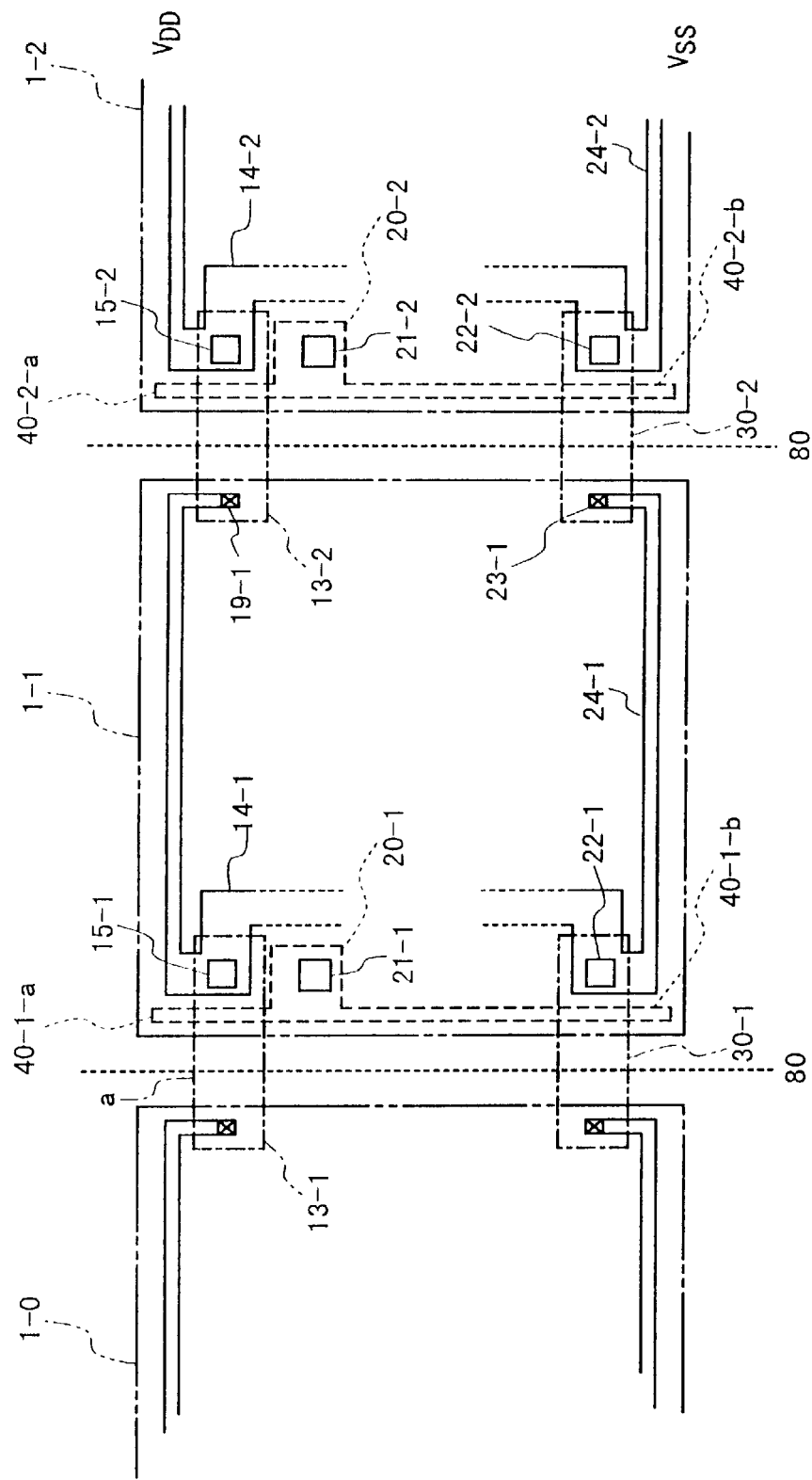
FIG. 6 is a plane arrangement view of a semiconductor device according to a second embodiment of the present invention.
Figure 7:
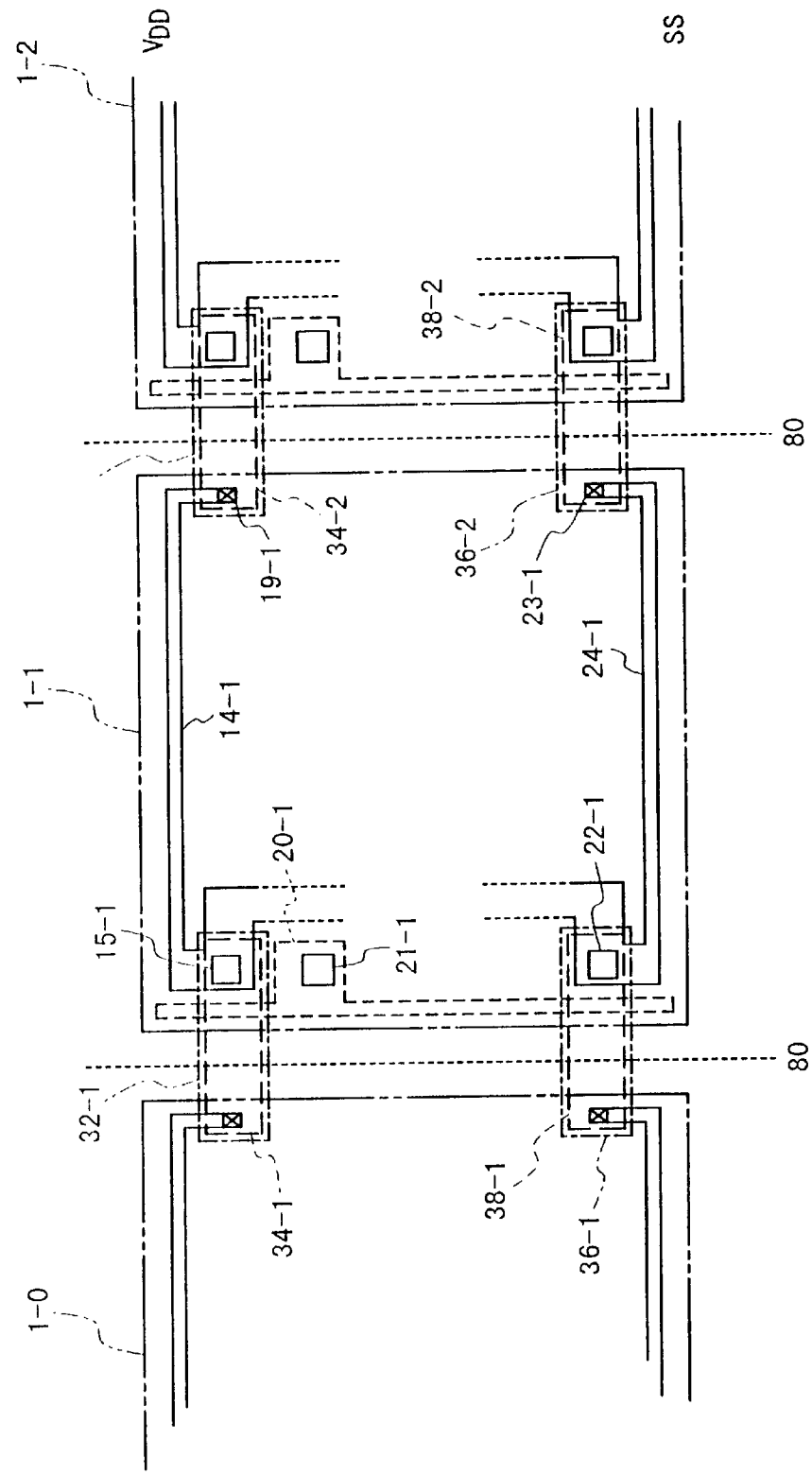
FIG. 7 is a plane arrangement view of a semiconductor device according to a third embodiment of the present invention.

Next, a semiconductor device according to the second embodiment of the present invention will be described. FIG. 6 is a pattern arrangement view of the semiconductor device in the second embodiment. According to the first embodiment mentioned above, the common impurity implanted area 10 is provided for the lower side power supply voltage $V_{SS}$. However, in this embodiment, the lower voltage side power supply pattern is formed in the same manner as the higher voltage side power supply pattern in the first embodiment.

That is, describing a semiconductor circuit 1-1 as an example with reference to FIG. 6, a lower voltage side power supply pattern 24-1 is formed on the wafer 90 through the insulating films 71 and 72. The lower voltage side power supply pattern 24-1 is connected to an impurity implanted area 30-1 by a contact in addition to the above internal circuit (not illustrated). Also, a lower voltage side power supply pad 22-1 is formed through the insulating film 72 on the contact between the lower voltage side power supply pattern 24-1 and the impurity implanted area 30-1. Thus, like the higher voltage side power supply pattern in the first embodiment, each semiconductor circuit 1 is connected to the low voltage side power supply pad $V_{SS}$ by the impurity implanted area 30. On the other hand, because the higher voltage side power supply pattern 14-1 is formed as in the first embodiment, the explanation is omitted.

Further, a control pattern 20-1 is formed via the insulating film 71 on the semiconductor wafer 90. One 40-1-a of the end sections of the control pattern 20-1 extends beyond the n-type impurity implanted area 13-1. Also, the other end section 40-1-b of the control pattern 20-1 extends beyond the n-type impurity implanted area 30-1. A control pad 21-1 is formed through the insulating film 72 above the control pattern 20-1.

In the semiconductor circuit 1-2, the higher potential side power supply pattern and the lower voltage side power supply pattern have the same structure as in the semiconductor circuit 1-1. In the semiconductor circuit 12, a control pattern 21-2 is formed through the insulating film 71 on the semiconductor wafer 90. End sections 40-2-a and 40-2-b of a control pattern 20-2 extends beyond the impurity implanted areas 13-2 and 30-2, respectively. A control pad 21-2 is formed through the insulating film 72 on the control pattern 20-2.

Because the operations in case of aging and probing are same as those in the first embodiment, the explanation is omitted. In this case, by applying a negative voltage to the control pads 21-1 and 21-2, depletion layers are generated in the four impurity implanted areas 13-1, 13-2, 30-1, and 30-2. Thus, the semiconductor circuit 1-1 is insulated from the other semiconductor circuits 1-0 and 1-2.

According to this embodiment, the semiconductor circuits are connected through the impurity implanted areas on the lower voltage side, like the higher voltage side.

Therefore, the semiconductor circuit can be more surely tested independent of the other semiconductor circuits. Also, because it is not necessary to provide the common impurity implanted area, the area on the semiconductor wafer can be more effectively used.

Also, according to this embodiment, the control pattern 20-1 extends to the higher voltage side power supply pattern and to the lower voltage side power supply pattern. In this case, although the number of control pads increases, the control pattern 11-1 which is shown in FIG. 2 may be provided for both of the higher voltage side and the lower voltage side.

Next, the semiconductor device according to the third embodiment of the present invention will be described. The basic structure of the third embodiment is substantially the same as the second embodiment. Therefore, only the different point will be described. In the third embodiment, the impurity implanted area becomes double structure. That is, p-type impurity implanted areas 34 (34-1, 34-2, . . . ) and 38 (38-1, 38-2, . . . ) are formed in n-type impurity implanted area wells 32 (32-1, 32-2, . . . ) and 36 (36-1, 36-2, . . . ), respectively. Therefore, according to this embodiment, a positive voltage is applied to the control pad 21 (21-1, . . . ) of the control pattern 20 (20-1, . . . ) to spread a depletion layer. Thus, the semiconductor circuit 1-1 in the third embodiment can operate in the same manner as those of the first and the second embodiment. Also, when the semiconductor circuit is cut down as a semiconductor chip, the positive power supply voltage of 3V or 5V is generally used as the higher potential side power supply voltage.

When the control pad 21 is connected to the power supply pad 15 on the higher voltage side, a depletion layer is formed in the impurity implanted areas 32 (32-1, . . . ) and 36 (36-1, . . . ). For this reason, the ends of the chip can be prevented from being exposed in the state in which a voltage is applied.

Figure 8:
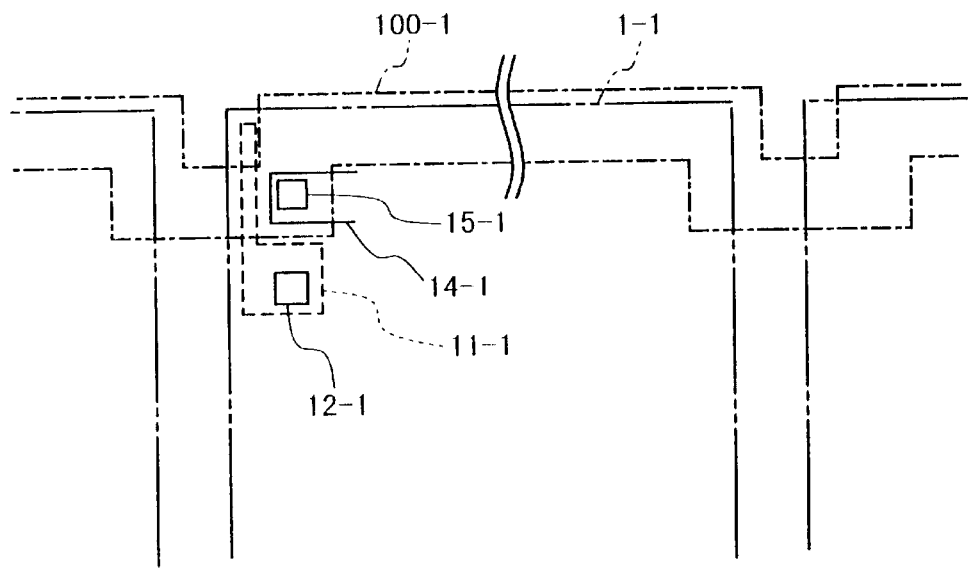
FIG. 8 is an example in which connection between chips is accomplished by a semiconductor layer.
Figure 9:
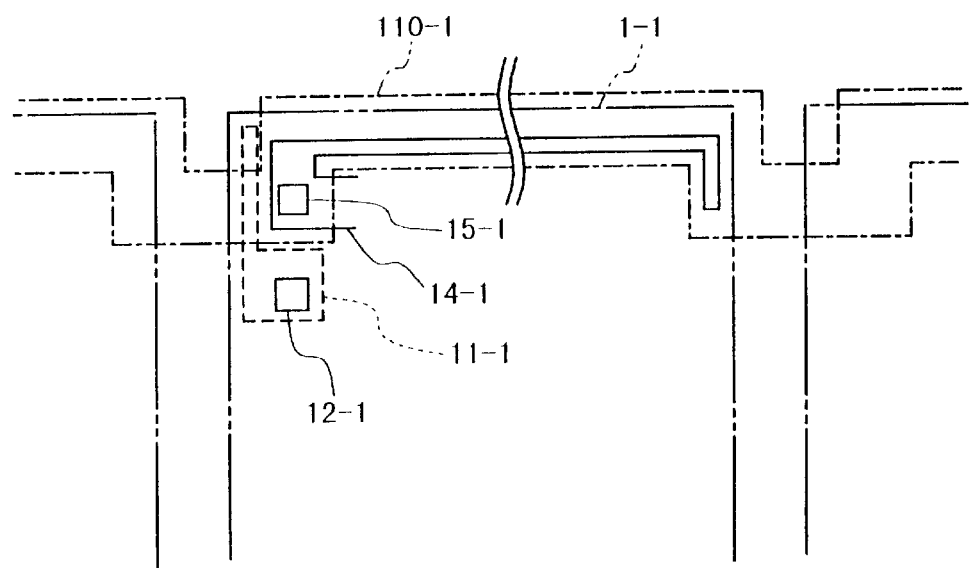
FIG. 9 is an example in which connection between chips is accomplished by both of a semiconductor layer and a power supply pattern.

According to this embodiment, the power supply patterns in the semiconductor circuit are provided independently. However, as shown in FIG. 8, connection in one or both of the higher voltage side and the lower voltage (GND) side between the semiconductor circuits may be performed through a semiconductor layer 100-1. In this case, when a negative voltage is applied to the pad 12-1, the control pattern functions to form a depletion layer in the semiconductor layer so that the semiconductor circuit is isolated. Instead, as shown in FIG. 9, the connection between the chips may be performed through a combination of a semiconductor layer 110-1 and the electrode (power supply) pattern 14-1.

As described above, according to the semiconductor device of the present invention, a plurality of semiconductor circuits can be aged collectively in a semiconductor wafer state. Also, the electrical characteristics of each of the plurality of semiconductor circuits can be measured in a semiconductor wafer state independent and individually.

What is claimed is:

1. A method of testing each of a plurality of semiconductor circuits formed on a semiconductor wafer, comprising the steps of:

providing a plurality of semiconductor circuits which are connected to power supply terminals provided onto said semiconductor wafer, wherein said plurality of semiconductor circuits provided on said semiconductor wafer are arranged in a plurality of rows, said semiconductor circuits of each row are connected in series through first and second conductive layers provided at least for adjacent two of said semiconductor circuits of each row;

connecting power supply to said power supply terminals and aging said plurality of semiconductor circuit in a semiconductor wafer state;

disconnecting said power supply from said power supply terminals after said aging; and measuring electrical characteristics of each of said plurality of semiconductor circuits in a state in which each of said plurality of semiconductor circuits is isolated from the other semiconductor circuits.

2. A method according to claim 1, wherein said first and second conductive layers are provided in said semiconductor wafer and connected to higher and lower potential side power supply lines provided in each of said semiconductor circuits of each row.

3. A method according to claim 2, wherein said each semiconductor circuit includes a control pattern for forming a MOSFET together with each of said first and second conductive layers, and wherein said measuring step includes applying a predetermined voltage to said control pattern of said each semiconductor circuit and said control pattern of said adjacent semiconductor circuit to isolate said each semiconductor circuit from the other semiconductor circuits.

4. A method according to claim 1, wherein one of said first and second conductive layers are provided independently from said each semiconductor circuit, and the other is provided in common to one of higher and lower potential side power supply lines of said each semiconductor circuit.

5. A method according to claim 4, wherein said each semiconductor circuit includes a control pattern for forming a MOSFET together with one of said first and second conductive layers, and wherein said measuring step includes applying a predetermined voltage to said control pattern of said each semiconductor circuit and said control pattern of said adjacent semiconductor circuit to isolate said each semiconductor circuit from the other semiconductor circuits.

* * * * *

UNITED STATES PATENT AND TRADEMARK OFFICE
CERTIFICATE OF CORRECTION

PATENT NO. : 6,063,641
DATED : May 16, 2000
INVENTOR(S) : Seki

It is certified that error appears in the above-identified patent and that said Letters Patent is hereby corrected as shown below:

On the title page, item:

Item [73], please delete "HONDA GIKEN KABUSHIKI KAISHA", and insert --HONDA GIKEN KOGYO KABUSHIKI KAISHA--

Signed and Sealed this

Twenty-second Day of May, 2001

Attest:

NICHOLAS P. GODICI

*Attesting Officer*     *Acting Director of the United States Patent and Trademark Office*